United States Patent [19]

Goronkin

[11] 4,340,900
[45] Jul. 20, 1982

[54] MESA EPITAXIAL DIODE WITH OXIDE PASSIVATED JUNCTION AND PLATED HEAT SINK

[75] Inventor: Herbert Goronkin, Scottsdale, Ariz.

[73] Assignee: The United States of America as represented by the Secretary of the Air Force, Washington, D.C.

[21] Appl. No.: 50,272

[22] Filed: Jun. 19, 1979

[51] Int. Cl.³ .................. H01L 29/06; H01L 29/90; H01L 23/02
[52] U.S. Cl. ........................ 357/56; 357/13; 357/81; 357/52
[58] Field of Search .................. 357/13, 56, 81, 52

[56] References Cited

U.S. PATENT DOCUMENTS

| | | | |
|---|---|---|---|
| 2,930,722 | 3/1960 | LiGenza | 357/56 |
| 3,040,218 | 6/1962 | Byczkowski | 357/56 |
| 3,093,507 | 6/1963 | Lander et al. | 357/56 |
| 3,294,600 | 12/1966 | Yokota | 357/56 |
| 3,300,841 | 1/1967 | Fisher et al. | 357/56 |
| 3,457,471 | 7/1969 | Moroney et al. | 357/56 |
| 3,537,889 | 11/1970 | Mets et al. | 357/56 |
| 4,028,140 | 6/1977 | Summers et al. | 357/56 |
| 4,064,620 | 12/1977 | Lee et al. | 357/56 |
| 4,080,621 | 3/1978 | Funakawa et al. | 357/56 |
| 4,097,890 | 6/1978 | Morris et al. | 357/55 |
| 4,099,987 | 7/1978 | Jambotkar | 357/56 |

FOREIGN PATENT DOCUMENTS 2373879  8/1978  France .................. 357/56

Primary Examiner—Andrew J. James
Attorney, Agent, or Firm—Donald J. Singer; Thomas L. Kundert

[57] ABSTRACT

An oxide passivated mesa epitaxial diode with an integral heat sink, and a process by which it may be fabricated. The passivation layer of highly pure thermally grown $SiO_2$ is formed over the mesa walls in the region of the pn junction without causing a reaction between the contact metals and their surroundings during the high temperature environment imposed during thermal growth. The heat sink is deposited after the $SiO_2$ passivation has been grown, replacing a polycrystalline silicon layer beneath the mesa formation which was used as a temporary structural support. Dopant, to form the pn junction, is introduced into the silicon wafer after the formation of the passivation layer but before the heat sink is deposited.

3 Claims, 7 Drawing Figures

MESA EPITAXIAL DIODE WITH OXIDE PASSIVATED JUNCTION AND PLATED HEAT SINK

RIGHTS OF THE GOVERNMENT

The invention described herein may be manufactured and used by or for the Government of the United States for all governmental purposes without the payment of any royalty.

BRIEF SUMMARY

The present invention is directed to a semiconductor device and a method by which the device may be fabricated. With more particularity, the device comprises an oxide passivated mesa epitaxial diode with an integral heat sink and is fabricated in such a manner that the junction is passivated by the thermal growth of an oxide layer over the junction region without causing a reaction between the contact metals and the surrounding environment.

In one form, the diode takes the shape of a mesa upon a supporting structure of thermally conductive metal, the latter serving both as an electrical contact and thermal heat sink. Directly upon the metallic base is the first semiconductor layer of the mesa, a heavily doped material of the first conductivity type. Covering the latter layer of the mesa is a layer of lightly doped material of the second conductivity type, opposite that of the first, forming therebetween a pn junction. Upon the lightly doped layer is a heavily doped layer of the same conductivity type, which is covered, at the mesa top, by a metallic contact. The side walls of the mesa structure, particularly in the region of the pn junction, are covered by a layer of highly pure $SiO_2$ material. The resultant device has low thermal and electrical resistance without sacrificing the quality of the surface passivation at the pn junction.

DETAILED DESCRIPTION

The thermal and electrical resistance properties of semiconductor diodes operating at microwave frequencies significantly affects their ultimate performance. Recently developed techniques for plating of the heat sinks directly onto the diode wafers are directed at improving such performance characteristics. Similarly, a process by which the junction in a mesa structure diode is passivated using thermally grown oxides has shown to produce low containment levels at the passive junction.

Figure 1:
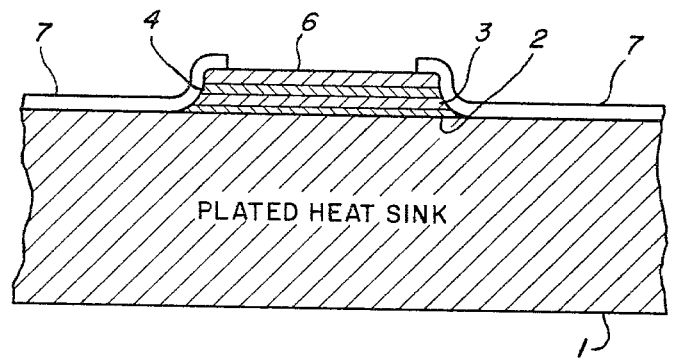
FIGS. 1 and 2 are cross-sectional schematics of prior art configurations.

Unfortunately, the two technological approaches have until now proven to be substantially incompatible. As a representative example, consider the varactor type of tuning diode shown in FIG. 1. The mesa epitaxial diode shown in the figure is fairly conventional, with plated heat sink 1 attached directly to p+ layer 2. Layer 3 of n type material and n+ type layer 4 are covered by metallized contact 6. The pn junction formed between layers 2 and 3 is protected by passivation layer 7. The mesa structure of the diode is etched in conventional fashion using photolithographic techniques, with the passivation layer being applied as one of the latter steps. Since thermally grown oxides require temperatures in excess of 1000° C., so high as to react contact metals such as layers 1 and 6 with their surroundings, passivation is normally done with pyrolytic oxides, such as those of $SiO_2$. These oxides are capable of being deposited at temperatures in the range of 300°–400° C. However, such low temperature passivation materials are also low in density and not hermetically stable. Often, these low melting temperature pyrolytic oxides are slightly contaminated with sodium or other elements, in relative comparison to thermally grown $SiO_2$, introducing a detrimental leakage current in shunt with the pn junction created by the migration of ions in the passivation layer. High quality passivation is the means by which a diode of this class is made both reliable and stable with regard to long term drift.

Figure 2:
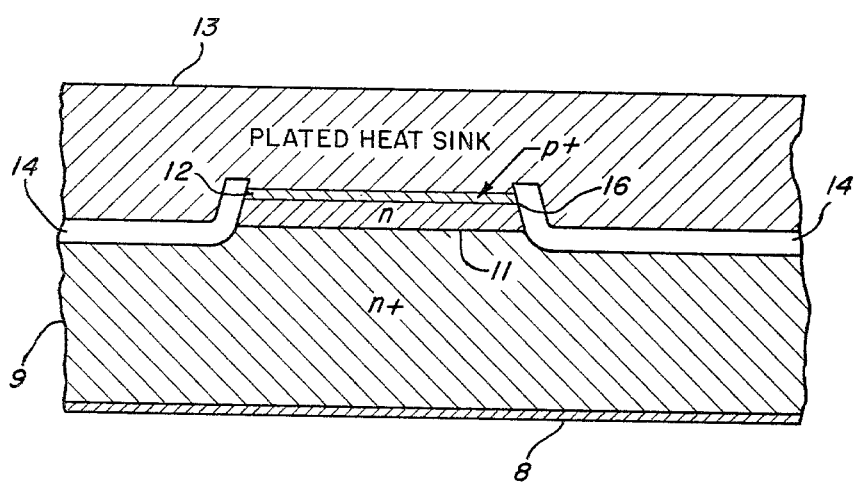

The structure typifying an alternate prior art approach to fabricating a mesa epitaxial diode with an integral heat sink is depicted schematically in the cross section of FIG. 2. The structure consists of a lower electrical contact layer 8, n+ type layer 9, n type layer 11, p+ type layer 12, plated heat sink layer 13, and passivation layer 14. A pn junction, 16, is formed at the interface of layers 11 and 12. Since passivation layer 14 is formed in conventional fashion prior to the formation of the electrical contacts, high temperatures may be utilized to thermally grow a passivation layer of $SiO_2$. Nevertheless, to prevent crazing of the oxide layer due to thermal mismatches with the underlying silicon, passivation layer 14 is limited to a thickness less than 2 microns. Unfortunately, a thickness of 2 microns or less for layer 14 is an insufficient separation between the electrical contact formed by heat sink layer 13 and the electrically conductive paths on the opposite side of pn junction 16. The result is a mesa diode exhibiting excessive parasitic reactances.

The invention disclosed herein overcomes these enumerated deficiencies, providing both a diode structure and a process for its fabrication. The particular embodiment described pertains to a silicon varactor tuning diode of an epitaxial mesa configuration, though it does apply with equal import to other types of microwave diodes in which high quality passivation and low thermal impedance are of prime consideration. Examples of such include, but are not limited to, IMPATT diodes, multiplier diodes and PIN diodes.

Figure 3:
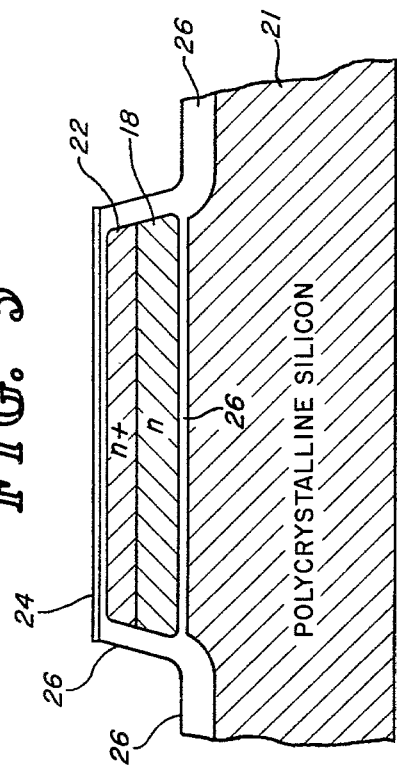
FIGS. 3 through 6 illustrate the device at various steps in the fabrication process.

Attention is directed to FIG. 3, where starting materials are shown to encompass a heavily doped n+ type silicon substrate layer 17 covered by a lightly doped n type silicon active layer 18. Arsenic or antimony is recommended for the substrate dopant. As a general rule the active region is n type because electrons have higher mobility than holes in silicon, though the structure and procedure here disclosed is not so limited. The pn junction is formed subsequently by introduction of p+ dopant into n type layer 18 at a later point in the process.

A $SiO_2$ layer 19 is thermally grown to cover n type layer 18 to a depth in the range of 1000 angstroms. Deposited thereon is polycrystalline silicon layer 21 to a depth of 100 microns for subsequent use as a temporary structural support. Upon the completion of the latter step, the cross section of the layers appears as shown in FIG. 3.

Figure 4:
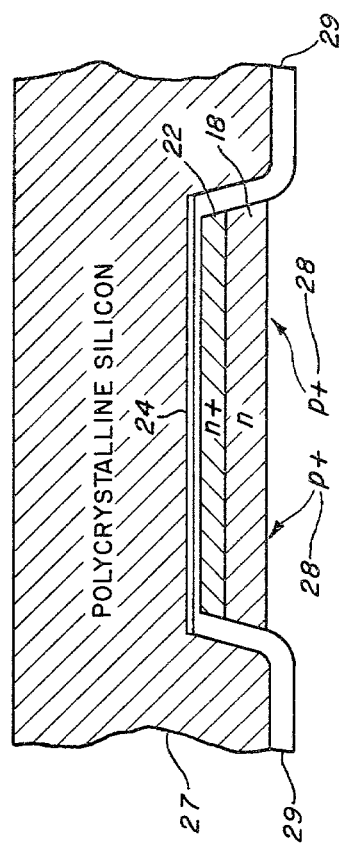

To reach the level of fabrication depicted in FIG. 4, n+ type layer 17 is first reduced in thickness by any appropriate thinning technique until it is 2-5 microns thicker than n type layer 18. A thermal growth of SiO$_2$ to a depth of approximately 1000 angstroms is then created on the surface of the remaining n+ type silicon. The SiO$_2$ layer, 23, is then covered by 1000 angstroms of Si$_3$N$_4$, layer 24, using conventional chemical vapor deposition (CVD) techniques. Once the diode pattern has been photolithographically defined, the Si$_3$N$_4$ layer is plasma etched in a conventional manner to leave a layer of Si$_3$N$_4$ directly over the area selected to be the diode mesa. The SiO$_2$ exposed by the etching of the Si$_3$N$_4$ layer is then etched away, leaving a thin mesa structure consisting of Si$_3$N$_4$ layer 24 over SiO$_2$ layer 23. Using an alkali solution which etches neither the SiO$_2$ nor the Si$_3$N$_4$ the exposed silicon layers, n type layer 18 and thinned layer 22 of n+ type silicon, are etched down to SiO$_2$ layer 19 on polycrystalline silicon 21. The mesa structure remaining appears in FIG. 4, showing the remanents of n type layer 18, n+ type layer 22, SiO$_2$ layer 23 and Si$_3$N$_4$ layer 24.

A less preferred technique for creating the epitaxial mesa form in FIG. 4 entails the deposition of 2000 angstroms CVD SiO$_2$ over the 1000 angstroms of Si$_3$N$_4$ prior to photolithographic definition of the diode pattern. Masking and etching then proceeds in a conventional manner through the CVD SiO$_2$ layer, the Si$_3$N$_4$ layer and the SiO$_2$ layer, until thinned n+ type silicon layer 22 is exposed for alkali solution etching in the manner described hereinbefore.

For purposes of relative comparison, the combined thickness of n type layer 18 and n+ type layer 22 in FIG. 4 is in the approximate range of 10 to 25 microns.

A layer 1 to 1.5 microns thick of SiO$_2$ is thermally grown on the silicon mesa and polycrystalline silicon support structure 21, effectively isolating n type layer 18 and n+ type layer 22 within a SiO$_2$ material formation, generally designated 26. Si$_3$N$_4$ layer 24 does not oxidize during this step. The structure so created is depicted in FIG. 5.

Figure 5:
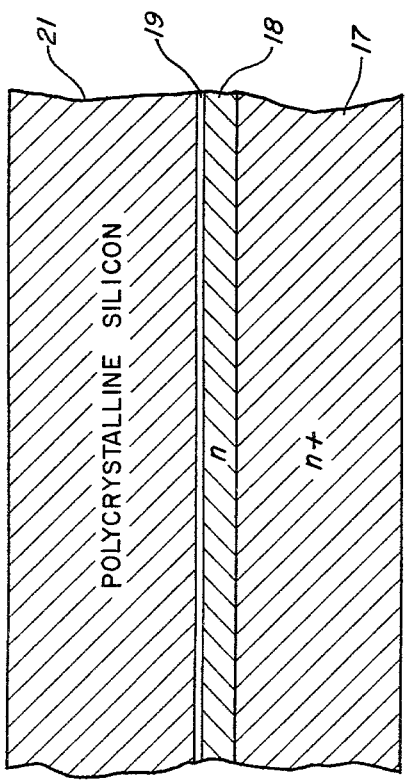
Figure 6:
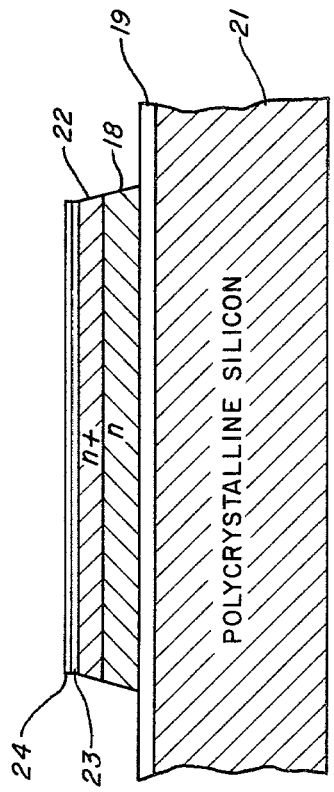

Commencing with the structure shown in FIG. 5 polycrystalline silicon 27 is deposited by conventional means over the mesa side to a thickness in the range of 100 microns. Thereafter, polycrystalline silicon support layer 21 is etched away with an alkali solution which does not attack SiO$_2$ formation 26. To expose n type layer 18, SiO$_2$ formation 26 is etched from beneath to remove approximately 1000 angstroms. The resulting structure resembles that depicted in FIG. 6. The pn junction is then created in n type layer 18 by implanting or diffusing p+ type dopant 28 into the surface of the layer. The p+ region can be made very shallow and abrupt if the thickness of n type layer 18 is carefully controlled during its formative steps.

Figure 7:
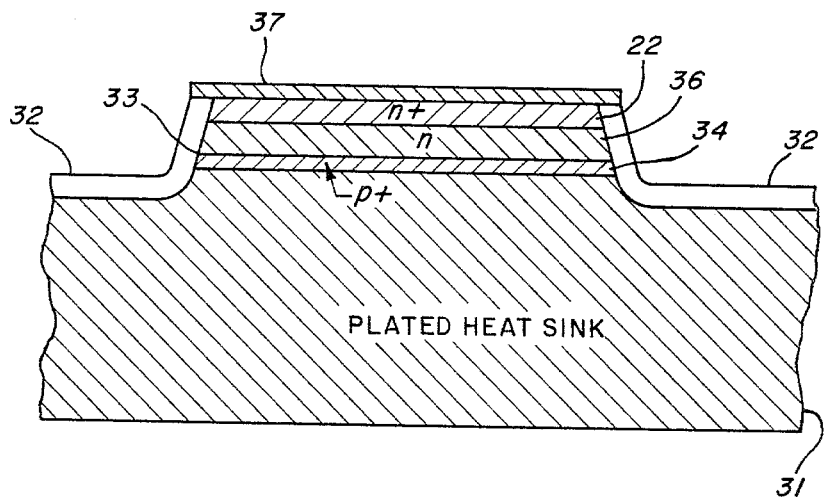
FIG. 7 is a cross-sectional schematic of an embodying device, fabricated in accordance with the disclosed process.

After the p+ region is created in n type layer 18, heat sink and electrical contact layer 31 of silver or copper is metallized and plated directly onto the newly created p+ region and remaining SiO$_2$ formation 29. Reference is directed to FIG. 7. A representative thickness for layer 31 is 100 microns. Polycrystalline silicon 27 is then etched away completely. Following this, exposed Si$_3$N$_4$ layer 24 is selectively etched away using a solution such as phosphoric acid which does not disturb the SiO$_2$. Thereafter, 1000 angstroms of SiO$_2$ is etched away, exposing only the surface of n+ type layer 22, while leaving a residual layer 32 of SiO$_2$ passivation on the side walls of the mesa epitaxial structure. The pn junction, 33, between p+ type region 34 and n type layer 36 remains passivated. The mesa epitaxial diode is completed, as shown in FIG. 7, when metallization layer 37 is formed over the top of the mesa by conventional means.

As noted hereinbefore the use of an n type active region is generally preferred, but the structure and process disclosed is not so limited. Though the finite steps described herein admit to digressions within the allowances of known technology, such limited departures remain within the spirit and scope of the invention.

I claim:

1. A silicon mesa epitaxial diode, comprising:
  a. a first layer of lightly doped silicon of a first conductivity type, said first layer comprising a base segment of a mesa structure;
  b. a second layer of heavily doped silicon of the first conductivity type in contact with said first layer and extending the mesa from said first layer;
  c. a passivation layer of highly pure SiO$_2$ thermally grown at a temperature in excess of 1000° C. on the mesa walls only of said first and second layers and continuing outwardly from said base segment, said passivation layer having a thickness of between 1 and 1.5 microns;
  d. means for providing a shallow abrupt pn junction in said first layer, said means including a layer of dopant of a second conductivity type diffused in a surface region of said first layer and extending across said surface region into contact with said layer of highly pure thermally grown SiO$_2$, said shallow abrupt pn junction characterized as being formed subsequent to the formation of said passivation layer so that diffusion of said dopant does not occur as a result of the thermal growth of said passivation layer;
  e. a thick layer of thermally and electrically conductive metal plated directly on said layer of dopant and said passivation layer continuing outwardly from said base segment; and
  f. a third layer of electrically conductive material on said second layer, said third layer in electrical contact with said second layer and extending the mesa from said second layer.

2. The device as recited in claim 1, wherein said first conductivity type is n and said second conductivity type is p.

3. The device as recited in claim 1, wherein said mesa walls are planar.

* * * * *